United States Patent
So et al.

(10) Patent No.: US 7,218,570 B2
(45) Date of Patent: May 15, 2007

(54) APPARATUS AND METHOD FOR MEMORY OPERATIONS USING ADDRESS-DEPENDENT CONDITIONS

(75) Inventors: Kenneth K. So, Belmont, CA (US); Luca G. Fasoli, San Jose, CA (US); Roy E. Scheuerlein, Cupertino, CA (US)

(73) Assignee: SanDisk 3D LLC, Sunnyvale, CA (US)

( * ) Notice: Subject to any disclaimer, the term of this patent is extended or adjusted under 35 U.S.C. 154(b) by 94 days.

(21) Appl. No.: 11/015,440

(22) Filed: Dec. 17, 2004

(65) Prior Publication Data

US 2006/0133125 A1    Jun. 22, 2006

(51) Int. Cl.
*G11C 8/00* (2006.01)

(52) U.S. Cl. .......................... 365/230.06; 365/189.09; 365/189.01

(58) Field of Classification Search ........... 365/230.06, 365/189.09, 189.01
See application file for complete search history.

(56) References Cited

U.S. PATENT DOCUMENTS

| | | | |
|---|---|---|---|
| 3,851,316 A | 11/1974 | Kodama | |
| 4,592,027 A | 5/1986 | Masaki | |
| 4,646,266 A | 2/1987 | Ovshinsky et al. | |
| 4,646,269 A | 2/1987 | Wong et al. | |
| 4,698,788 A | 10/1987 | Flannagan et al. | |
| 4,744,061 A | 5/1988 | Takemae et al. | |
| 4,873,669 A | 10/1989 | Furutani et al. | |
| 5,107,139 A | 4/1992 | Houston et al. | |
| 5,149,199 A | 9/1992 | Kinoshita et al. | |
| 5,276,644 A | 1/1994 | Pascucci et al. | |
| 5,276,649 A | 1/1994 | Hoshita et al. | |
| 5,278,796 A | 1/1994 | Tillinghast et al. | |
| 5,359,571 A | 10/1994 | Yu | |
| 5,383,157 A | 1/1995 | Phelan | |
| 5,410,512 A | 4/1995 | Takase et al. | |
| 5,652,722 A | 7/1997 | Whitefield | |
| 5,745,410 A | 4/1998 | Yiu | |
| 5,784,328 A | 7/1998 | Irrinki et al. | |
| 5,818,748 A | 10/1998 | Bertin et al. | |
| 5,835,396 A | 11/1998 | Zhang | |
| 5,890,100 A | 3/1999 | Crayford | |
| 5,923,588 A | 7/1999 | Iwahashi | |

(Continued)

OTHER PUBLICATIONS

"A 14ns 1Mb CMOS SRAM with Variable Bit-Organization," Wada et al., 1988 IEEE International Solid-State Circuits Conference, pp. 252-253 (Feb. 19, 1988).

(Continued)

*Primary Examiner*—David Lam
(74) *Attorney, Agent, or Firm*—Brinks Hofer Gilson & Lione

(57) ABSTRACT

An apparatus is disclosed comprising a plurality of word lines and word line drivers, a plurality of bit lines and bit line drivers, and a plurality of memory cells coupled between respective word lines and bit lines. The apparatus also comprises circuitry operative to select a writing and/or reading condition to apply to a memory cell based on the memory cell's location with respect to one or both of a word line driver and a bit line driver. The apparatus can also comprise circuitry that is operative to select a number of memory cells to be programmed in parallel based on memory cell location with respect to a word line and/or bit line driver.

45 Claims, 9 Drawing Sheets

U.S. PATENT DOCUMENTS

| | | | |
|---|---|---|---|
| 5,925,996 | A | 7/1999 | Murray |
| 5,940,340 | A | 8/1999 | Ware et al. |
| 5,961,215 | A | 10/1999 | Lee et al. |
| 5,977,746 | A | 11/1999 | Hershberger et al. |
| 6,034,882 | A | 3/2000 | Johnson et al. |
| 6,034,918 | A | 3/2000 | Farmwald et al. |
| 6,055,180 | A | 4/2000 | Gudesen et al. |
| 6,070,222 | A | 5/2000 | Farmwald et al. |
| 6,157,244 | A | 12/2000 | Lee et al. |
| 6,185,121 | B1 | 2/2001 | O'Neill |
| 6,185,712 | B1 | 2/2001 | Kirihata et al. |
| 6,191,980 | B1 * | 2/2001 | Kelley et al. ......... 365/185.29 |
| 6,205,074 | B1 | 3/2001 | Van Buskirk et al. |
| 6,208,545 | B1 | 3/2001 | Leedy |
| 6,212,121 | B1 | 4/2001 | Ryu et al. |
| 6,236,587 | B1 | 5/2001 | Gudesen et al. |
| 6,240,046 | B1 | 5/2001 | Proebsting |
| 6,246,610 | B1 | 6/2001 | Han et al. |
| 6,335,889 | B1 | 1/2002 | Onodera |
| 6,356,485 | B1 | 3/2002 | Proebsting |
| 6,373,768 | B2 | 4/2002 | Woo et al. |
| 6,385,074 | B1 | 5/2002 | Johnson et al. |
| 6,407,953 | B1 | 6/2002 | Cleeves |
| 6,420,215 | B1 | 7/2002 | Knall et al. |
| 6,507,238 | B1 | 1/2003 | Yang |
| 6,525,953 | B1 | 2/2003 | Johnson |
| 6,560,152 | B1 | 5/2003 | Cernea |
| 6,574,145 | B2 | 6/2003 | Kleveland et al. |
| 6,577,549 | B1 | 6/2003 | Tran et al. |
| 6,661,730 | B1 | 12/2003 | Scheuerlein et al. |
| 6,724,665 | B2 | 4/2004 | Scheuerlein et al. |
| 6,754,124 | B2 | 6/2004 | Seyyedy et al. |
| 6,791,875 | B2 * | 9/2004 | Hidaka ....................... 365/171 |
| 6,925,007 | B2 * | 8/2005 | Harari et al. .......... 365/185.15 |
| 6,980,465 | B2 * | 12/2005 | Taussig et al. .............. 365/158 |
| 2002/0028541 | A1 | 3/2002 | Lee et al. |
| 2002/0136045 | A1 | 9/2002 | Scheuerlein |
| 2002/0136047 | A1 | 9/2002 | Scheuerlein |
| 2003/0043643 | A1 | 3/2003 | Scheuerlein et al. |
| 2003/0046020 | A1 | 3/2003 | Scheuerlein |
| 2004/0066671 | A1 | 4/2004 | Scheuerlein et al. |
| 2004/0100831 | A1 | 5/2004 | Knall et al. |

OTHER PUBLICATIONS

"64M×8 Bit NAND Flash Memory," Samsung Electronics (Oct. 27, 2000).

"How Flash Memory Works," wysiwyg://8/http://www.howstuffworks.com/flash-memory.htm?printable=1, 5 pages (1998).

"Datalight FlashFX™ 4.06 User's Guide," p. 11 (Aug. 2000).

"How Does TrueFFS® manage Wear Leveling?," http://www.m-sys.com/content/information/calcInfo.asp, 2 pages (printed Oct. 5, 2001).

"A CMOS Bandgap Reference Circuit with Sub-1V Operation," IEEE Journal of Solid-State Circuits, vol. 34, No. 5, May 1999, pp. 670-674.

"Sub-1V CMOS Proportional to Absolute Temperature References," IEEE Journal of Solid-State Circuits, vol. 38, No. 1, Jan. 2003, pp. 85-89.

"The flash memory read path: building blocks and critical aspects," Micheloni et al., Proceedings of the IEEE, vol. 91, No. 4, Apr. 2003, pp. 537-553.

"A current-based reference-generations scheme for 1T-1C ferroelectric random-access memories," Siu et al., IEEE Journal of Solid-State Circuits, vol. 38 Issue 3, Mar. 2003, pp. 541-549.

"Method and System for Temperature Compensation for Memory Cells with Temperature-Dependent Behavior," U.S. Appl. No. 10/676,862, filed Sep. 20, 200; inventors: Kenneth So, Luca Fasoli, and Bendik Kleveland.

Written Opinion for PCT/US05/43074, 5 pages, Jul. 27, 2006.

International Search Report for PCT/US05/43074, 1 page, Jul. 27, 2006.

* cited by examiner

APPARATUS AND METHOD FOR MEMORY OPERATIONS USING ADDRESS-DEPENDENT CONDITIONS

BACKGROUND

To program a memory cell, word line and bit line drivers associated with the memory cell can be driven with a supplied word line voltage and bit line voltage, respectively. The memory cell is programmed when the voltage across the memory cell is greater than a threshold voltage. To read a memory cell, word line and bit line drivers associated with the memory cell can be driven with a supplied word line voltage and bit line voltage, respectively, and a sense amplifier associated with the memory cell compares the current flowing out of the memory cell to a reference current. If the memory cell is programmed, the current will be greater than the reference current; otherwise, the current will be lower than the reference current. Writing and reading errors can occur when resistances along a word line and bit line cause the actual voltage received by a memory cell (and, hence, the current passing through the memory cell) to drop.

SUMMARY

The present invention is defined by the following claims, and nothing in this section should be taken as a limitation on those claims.

By way of introduction, the preferred embodiments described below provide an apparatus and method for memory operations using address-dependent conditions. In one preferred embodiment, an apparatus is provided comprising a plurality of word lines and word line drivers, a plurality of bit lines and bit line drivers, and a plurality of memory cells coupled between respective word lines and bit lines. The apparatus also comprises circuitry operative to select a writing and/or reading condition to apply to a memory cell based on the memory cell's location with respect to one or both of a word line driver and a bit line driver. In another preferred embodiment, circuitry is provided that is operative to select a number of memory cells to be programmed in parallel based on memory cell location with respect to a word line and/or bit line driver. Other preferred embodiments are provided, and each of the preferred embodiments described herein can be used alone or in combination with one another.

The preferred embodiments will now be described with reference to the attached drawings.

DETAILED DESCRIPTION OF THE PRESENTLY PREFERRED EMBODIMENTS

Figure 1:
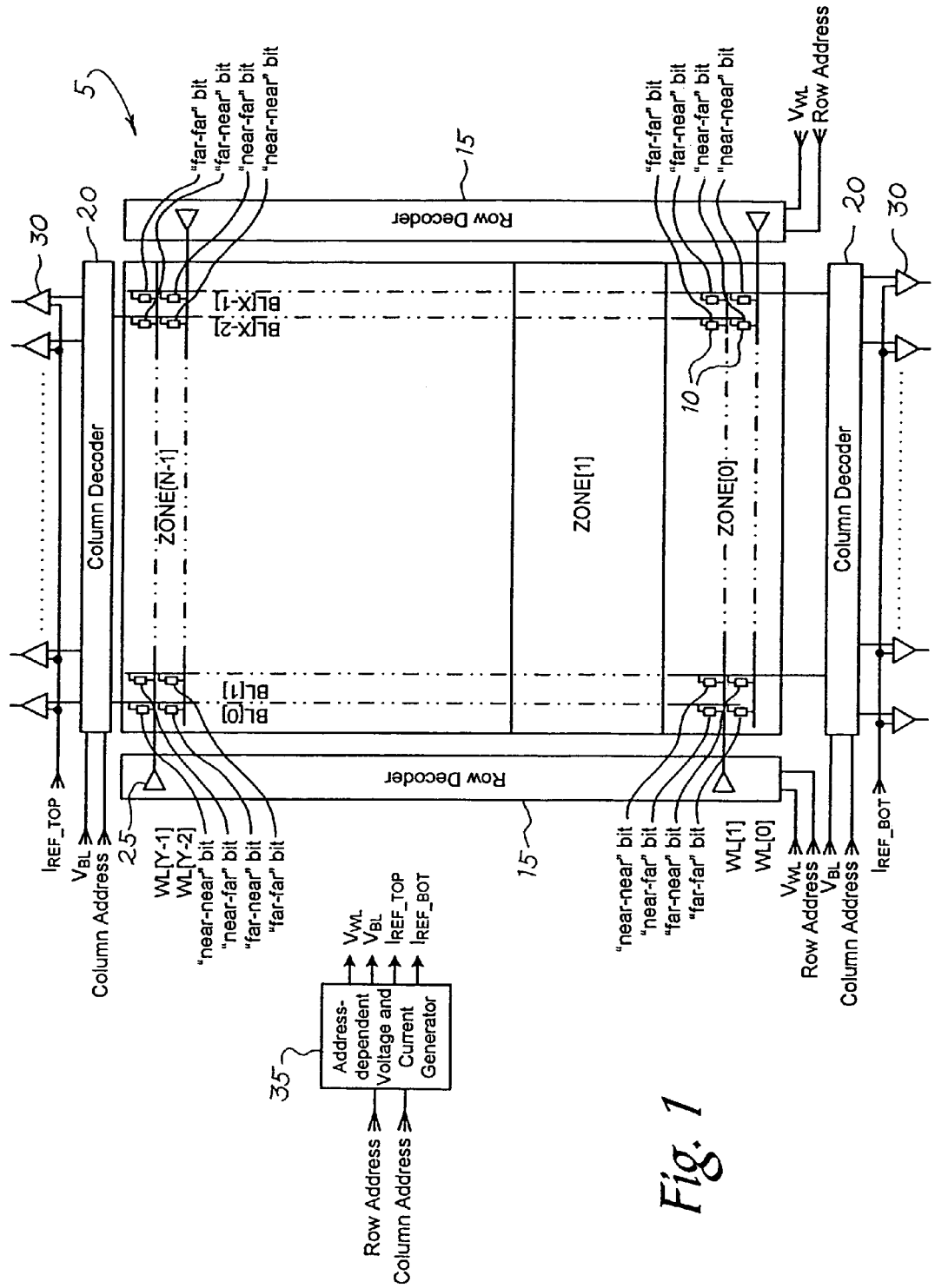
FIG. 1 is an illustration of a memory apparatus of a preferred embodiment.

Turning now to the drawings, FIG. 1 is an illustration of a memory apparatus 5 of a preferred embodiment. The apparatus 5 can be part of a modular, compact, handheld unit, such as a memory card or stick, used in a consumer electronics device such as, but not limited to, a digital camera, a personal digital assistant, a cellular phone, a digital audio player, or a personal computer. The apparatus 5 comprises a plurality of word lines (WL[0], WL[1] . . . WL[Y-2], WL[Y-1]), a plurality of bit lines (BL[0], BL[1] . . . BL[X-2], BL[X-1]), and a memory array comprising a plurality of memory cells 10 coupled between respective word lines and bit lines. In this embodiment, the memory array comprises relatively long bit lines and relatively short word lines. The memory cells 10 can take any suitable form, including, but not limited to, write-once memory cells (i.e., one-time programmable), write-many memory cells, few-time programmable memory cells (i.e., memory cells that are programmable more than once but not as many times as a write-many memory cell), or any combination thereof. The memory cells can be organized in a single layer (i.e., a two-dimensional array) or in a plurality of layers stacked vertically above one another above a single substrate (i.e., a three-dimensional array), as described in U.S. Pat. No. 6,034,882 to Johnson et al. and U.S. Pat. No. 6,420,215 to Knall et al., both of which are assigned to the assignee of the present invention and are hereby incorporated by reference. In the embodiments described herein, the memory cell takes the form of a semiconductor antifuse, whose dielectric is ruptured when programmed. Other types of memory cells can be used.

The apparatus 5 also comprises a row decoder 15 and a column decoder 20 that are coupled with the word lines and bit lines, respectively. As used herein, the phrase "coupled with" means directly coupled with or indirectly coupled with through one or more named or unnamed components. Both the row decoder 15 and the column decoder 20 are split on opposite sides of the memory array. The row decoder 15 comprises a plurality of word line drivers 25, one for each word line. Similarly, the column decoder 20 comprises a plurality of bit line drivers (not shown), one for each bit line. The apparatus 5 also comprises a plurality of sense amplifiers 30 coupled with the column decoder 20, as well as an address-dependent voltage and current generator 35, which selects a writing and/or reading condition to apply to a memory cell based on the memory cell's location with respect to one or both of a word line driver and a bit line driver, as will be discussed in further detail below.

In operation, to select a memory cell for a write or read operation, a row address is provided to the row decoder 15, and a column address is provided to the column decoder 20. The row decoder 15 and column decoder 20 determine which word line and bit line, respectively, correspond to the provided row and column address, and the apparatus 5 applies a writing condition or reading condition to the selected memory cell. As used herein, the terms "writing condition" and "reading condition" can refer to one or both of a forcing function and a reference. A forcing function can be, for example, a voltage source, a current source, a generated wave shape (e.g., high impedance or low impedance), a charge packet, or other driving stimuli. A reference can be, for example, a current reference or a voltage reference. Other types of writing and reading conditions can be used.

To program a memory cell, the word line and bit line drivers associated with the memory cell are driven with a supplied word line voltage ($V_{WL}$) and bit line voltage ($V_{BL}$), respectively. (A supplied voltage can be ground.) The memory cell is programmed when the voltage across the memory cell is greater than a threshold voltage. In this example, the supplied word line and bit line voltages are the "writing condition." When a sensing-while-programming (or smart-write) technique is used, the "writing condition" would be both the supplied word line and bit line voltages, as well as the reference current. Smart write compares the current flowing out of a memory cell to a reference current while the memory cell is being programmed. When the current from the memory cell exceeds the reference current, the memory cell is programmed, and the programming of the memory cell can be halted. This increases programming bandwidth as compared to programming techniques that apply a voltage across a memory cell for a fixed amount of time. More detail on a preferred sensing-while-programming technique can be found in U.S. Pat. No. 6,574,145, which is assigned to the assignee of the present invention and is hereby incorporated by reference.

Similarly, to read a memory cell, the word line and bit line drivers associated with the memory cell are driven with a supplied word line voltage ($V_{WL}$) and bit line voltage ($V_{BL}$), respectively, and the sense amplifier 30 associated with the memory cell compares the current flowing out of the memory cell to a reference current. If the memory cell is programmed, the current will be greater than the reference current; otherwise, the current will be lower than the reference current. In this example, the "reading condition" is the supplied word line voltage ($V_{WL}$) and bit line voltage ($V_{BL}$) and the reference current. As mentioned above, writing and reading conditions can take other forms.

Figure 2:
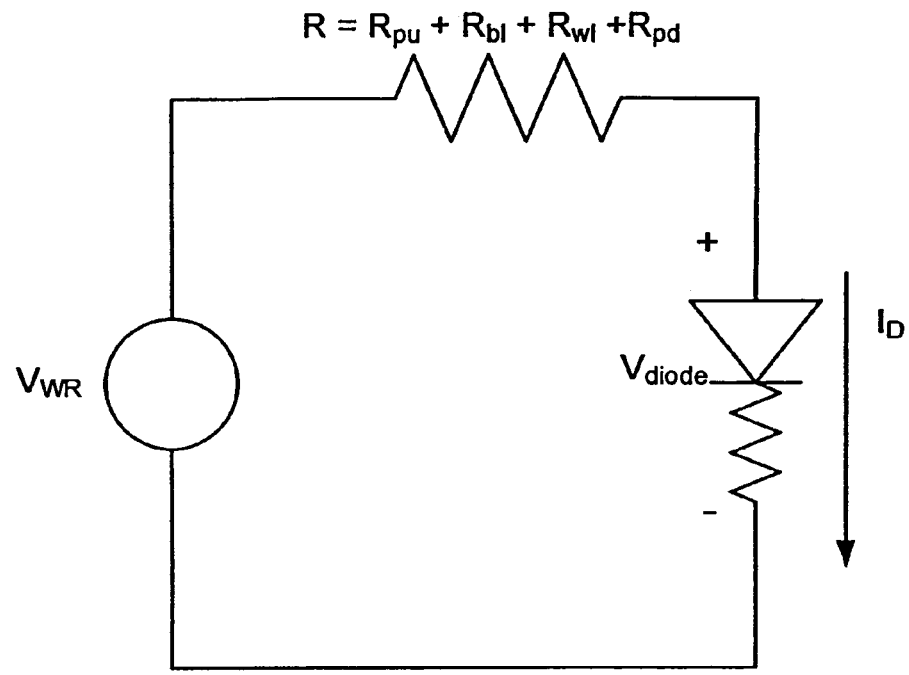
FIG. 2 is a circuit diagram illustrating the dependence of a voltage across a memory cell on word line and bit line resistances.

Because of resistances along a word line and bit line, the actual voltage received by a memory cell is a function of the memory cell's location with respect to the word line and bit line drivers. FIG. 2 is a circuit diagram illustrating the dependence of a voltage across a memory cell on word line and bit line resistances. As shown in this figure, several resistances (R) cause the voltage across a memory cell ($V_{diode}$) to be different from the write voltage supply, which is the difference between the bit line voltage supply and the word line voltage supply ($V_{WR}=V_{BL}-V_{WL}$). The total equivalent resistance (R) comprises the pull-up resistance in the column decoder 20 ($R_{pu}$), the pull-down resistance in column decoder 20 ($R_{pd}$), the bit line resistance ($R_{bl}$), and the word line resistance ($R_{wl}$). The voltage drop across the memory cell ($V_{diode}$) also causes a drop in the memory cell current ($I_D$). Accordingly, the voltage applied to a memory cell and the current read from a memory cell depend on the memory cell's location with respect to one or both of a word line driver and a bit line driver, as the bit line and word line resistances increase as the memory cell is located further along a bit line and a word line, respectively.

Referring again to FIG. 1, four categories are used in this preferred embodiment to characterize a memory cell's location with respect to word line and bit line drivers: far-far, far-near, near-far, and near-near. A far-far bit is a memory cell furthest from the word line driver and furthest from the bit line driver within a single memory array. A far-near bit is a memory cell farthest from the word line driver and closest to the bit line driver within a single memory array. A near-far bit is a memory cell closest to the word line driver and furthest from the bit line driver within a single memory array. A near-near bit is a memory cell closest to the word line driver and closest to the bit line driver within a single memory array. Of course, other categories can be used.

Since a memory cell is subjected to conditions (e.g., resistances) that vary based on the location of the memory cell in reference to the word line and bit line select circuits (i.e., drivers), applying the same writing and reading conditions to all memory cells in the array can result in programming and reading errors. For example, in a normal read or programming operation, a well-controlled voltage is applied at the word line and bit line driver outputs. The actual voltage across memory cell is lower if it were a far-far bit than if it were a near-near bit because the resistance of along the word line and the bit line causes the voltage to drop. A variation in actual voltage across the memory cell would cause a reduction in read margin, a reduction in programming margin, and a reduction in write sensing margin. Each of these reductions will now be discussed.

Figure 3:
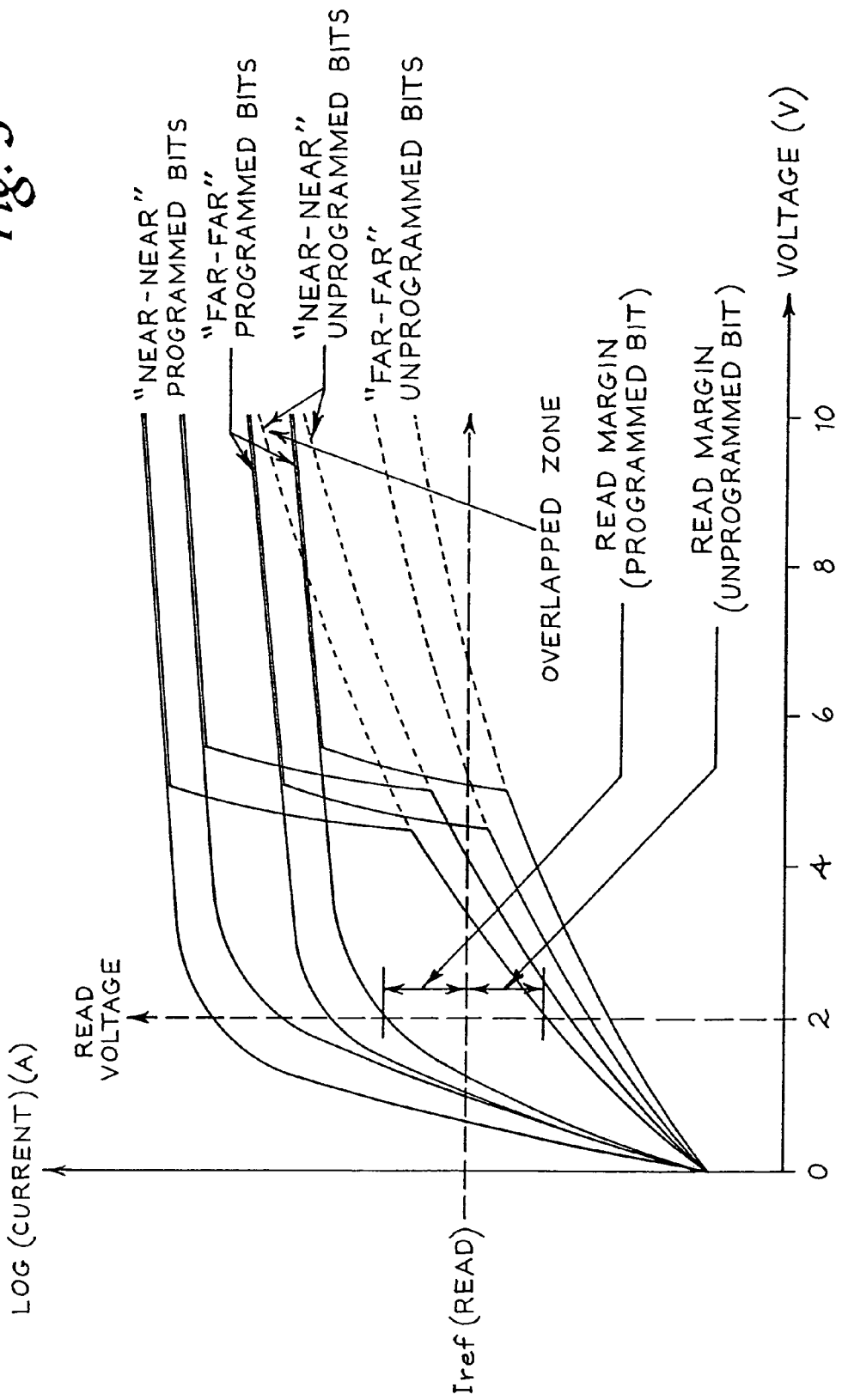
FIG. 3 is a graph of current-voltage curves for a forward-biased one-time programmable memory cell of a preferred embodiment illustrating an uncompensated memory read scenario.

Turning first to the reduction in read margin, the lower the voltage across the memory cell, the lower the current that the cell conducts. This relationship is shown in FIG. 3, which is a graph of current-voltage curves for a forward-biased one-time programmable memory cell in the near-near and far-far fields in both programmed and unprogrammed states. The two curves shown for each type of memory cell represent the lower and upper limits in a distribution that is caused from variations in the manufacturing process, for example. As shown in this graph, for a given read voltage of two volts, near-near programmed bits generate greater memory cell current than far-far programmed bits. The same is true for unprogrammed bits. The read margin (or read sensing window) is the tolerance in total allowable variations in voltage and current that can be accepted for correct reading To ensure that a programmed far-far bit generates enough current to be read as a programmed memory cell, the overall read voltage can be raised to accommodate for the high resistance seen by a far-far bit. However, the increased voltage could cause a leaky unprogrammed near-near bit to conduct more current than the reference current, which would result in the unprogrammed near-near memory cell being misinterpreted as being in a programmed state. The same problem occurs if the read voltage fluctuates. If the read voltage drops below two volts, the current conducted by a weakly-programmed far-far bit falls within the read window. That is, the read window that existed at two volts no longer exists. Accordingly, that weakly-programmed far-far bit will be read as an unprogrammed memory cell if the reference current varies as high as the upper limit of the read margin. Similarly, if the read voltage rises above two volts, the current conducted by a strongly-unprogrammed near-near bit (represented by the upper curve for the near-near unprogrammed bits) falls within the read window. Accordingly, that strongly-unprogrammed near-near bit will be read as a programmed memory cell if the reference current varies as low as the lower limit of the read margin.

To overcome this problem, the apparatus 5 can comprise circuitry that selects a reading condition (e.g., voltage or reference current) to apply to a memory cell that depends on the memory cell's location with respect to one or both of a word line driver and a bit line driver. This can be accomplished by selecting a condition to apply to a memory cell that is address-dependent to compensate for the problem. In other words, because the lack of/insufficient an operating window is a function of the location of a selected memory cell with respect to word line and/or bit line drivers, a window can be created by applying address-dependent reading conditions. Even if an operating window exists, using address-dependent reading conditions can improve the robustness of the design by increasing the read margin.

Figure 4:
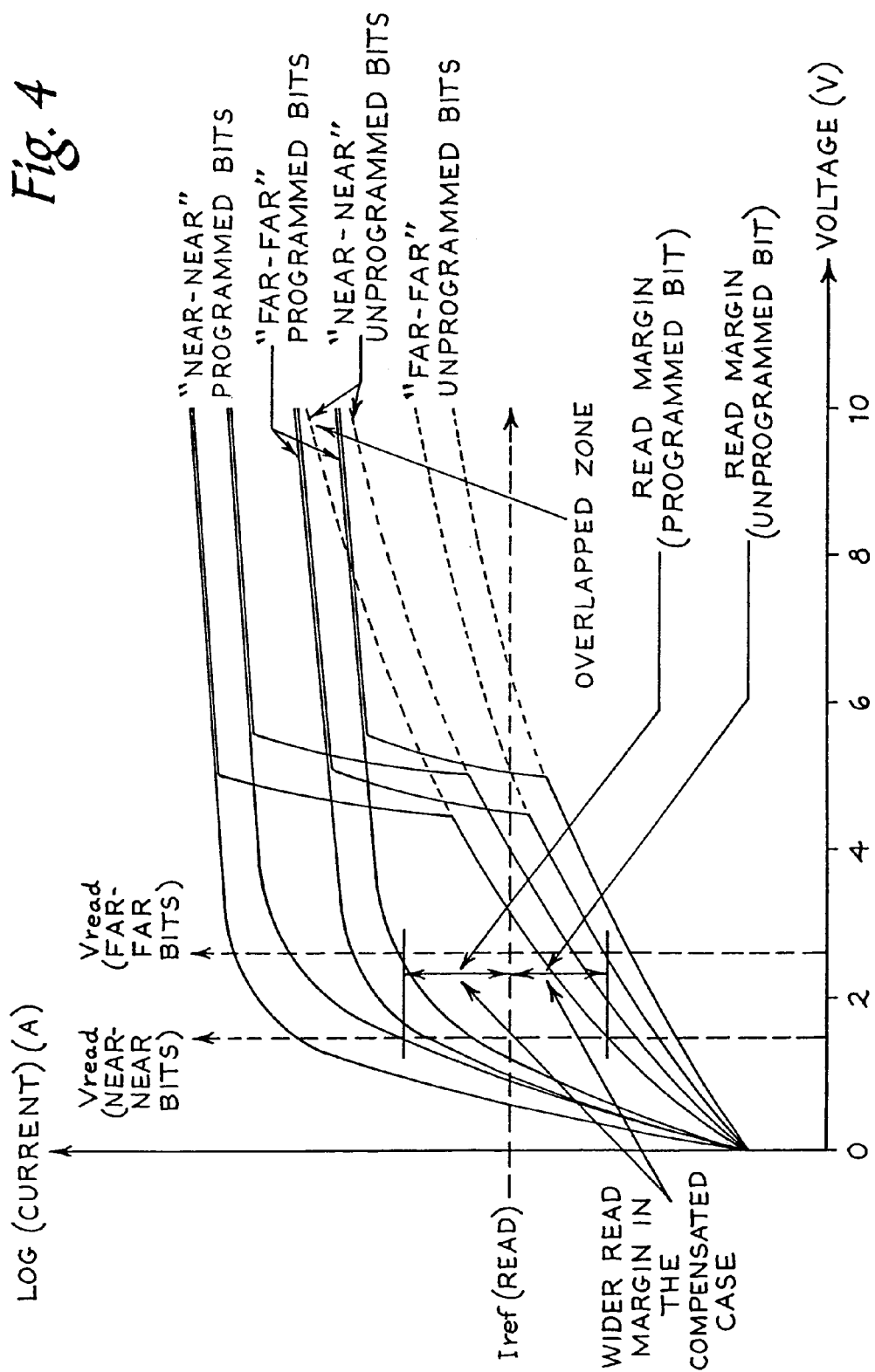
FIG. 4 is a graph of current-voltage curves for a forward-biased one-time programmable memory cell of a preferred embodiment illustrating an address-dependent $V_{diode}$ compensated memory read scenario.
Figure 5:
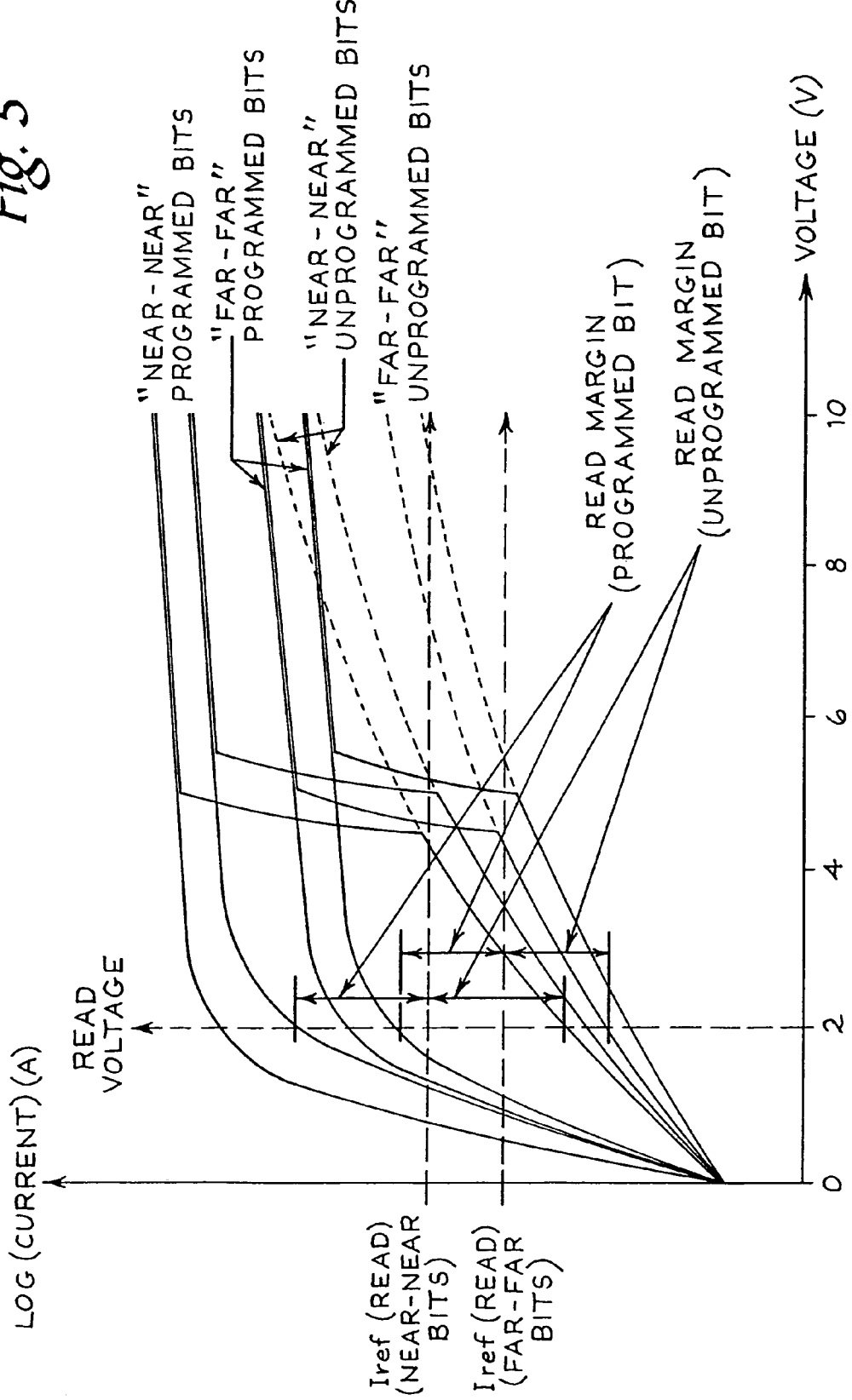
FIG. 5 is a graph of current-voltage curves for a forward-biased one-time programmable memory cell of a preferred embodiment illustrating an address-dependent $I_{ref}$ compensated memory read scenario.

FIGS. 4 and 5 illustrate how circuitry can compensate for the voltage and current drops by adjusting the applied voltage and the reference current, respectively, based on the memory cell's location/address. As shown in FIG. 4, by applying a lower $V_{read}$ for near-near bits than for far-far bits, a wider read margin is present. In FIG. 5, the read voltage is kept constant, but the reference current is changed depending on whether the memory cell being read is a near-near bit or a far-far bit. As with varying voltage, varying reference current based on address provides for a larger read margin than in the uncompensated case shown in FIG. 3. It is important to note that while FIGS. 4 and 5 show one of the voltage and reference current being fixed while the other is varied, both the voltage and reference current can vary together.

Figure 6:
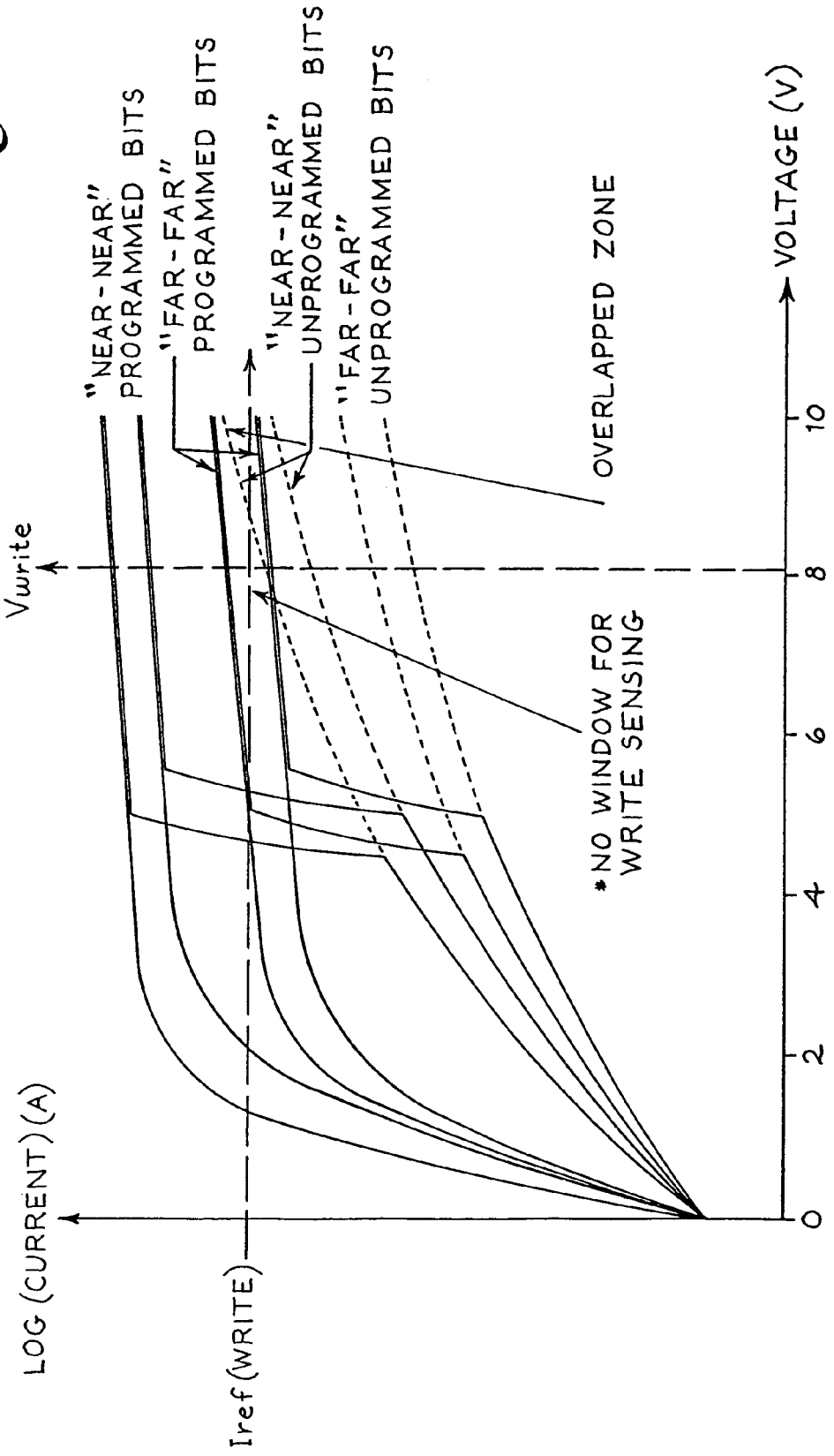
FIG. 6 is a graph of current-voltage curves for a forward-biased one-time programmable memory cell of a preferred embodiment illustrating an uncompensated memory write sensing scenario.

Similar to the read margin problem, a write sensing problem exists when a sensing-while-programming ("smart write") technique is used. As described above, the smart write technique compares the current flowing out of a memory cell to a reference current while the memory cell is being programmed. Once the current exceeds the reference current (indicating that the memory cell has been programmed), the write cycle for that memory cell ends, and the write cycle for another memory cell begins. This technique increases programming bandwidth especially when a group of memory cells is programmed in parallel along the same physical word line. However, the write current can be limited in this situation, and the current limit is also used as a current reference to sense back the programming of the memory cell. In some situations, this results in no window for write sensing. FIG. 6 is a graph that illustrates this problem. Because of a lack of a write sense window, the current passing through a weakly-programmed far-far bit will be less than the reference current, resulting in the programmed memory cell being read as an unprogrammed bit. Accordingly, it is desired to set the reference current such that all the programmed cells are above the current reference, and all the unprogrammed cells are below the current reference. However, if the current reference is set to accommodate the near-near bits, the same current reference setting may be higher than the far-far programmed bits, as shown in FIG. 6. This will cause a write timeout for far-far programmed bits. Conversely, if the current reference is set to accommodate the far-far bits, the same current reference setting may be lower than the near-near unprogrammed bits. This will cause the "smart-write" circuitry to think that the near-near unprogrammed bit has been programmed and to move onto the next set of bits prematurely.

Figure 7:
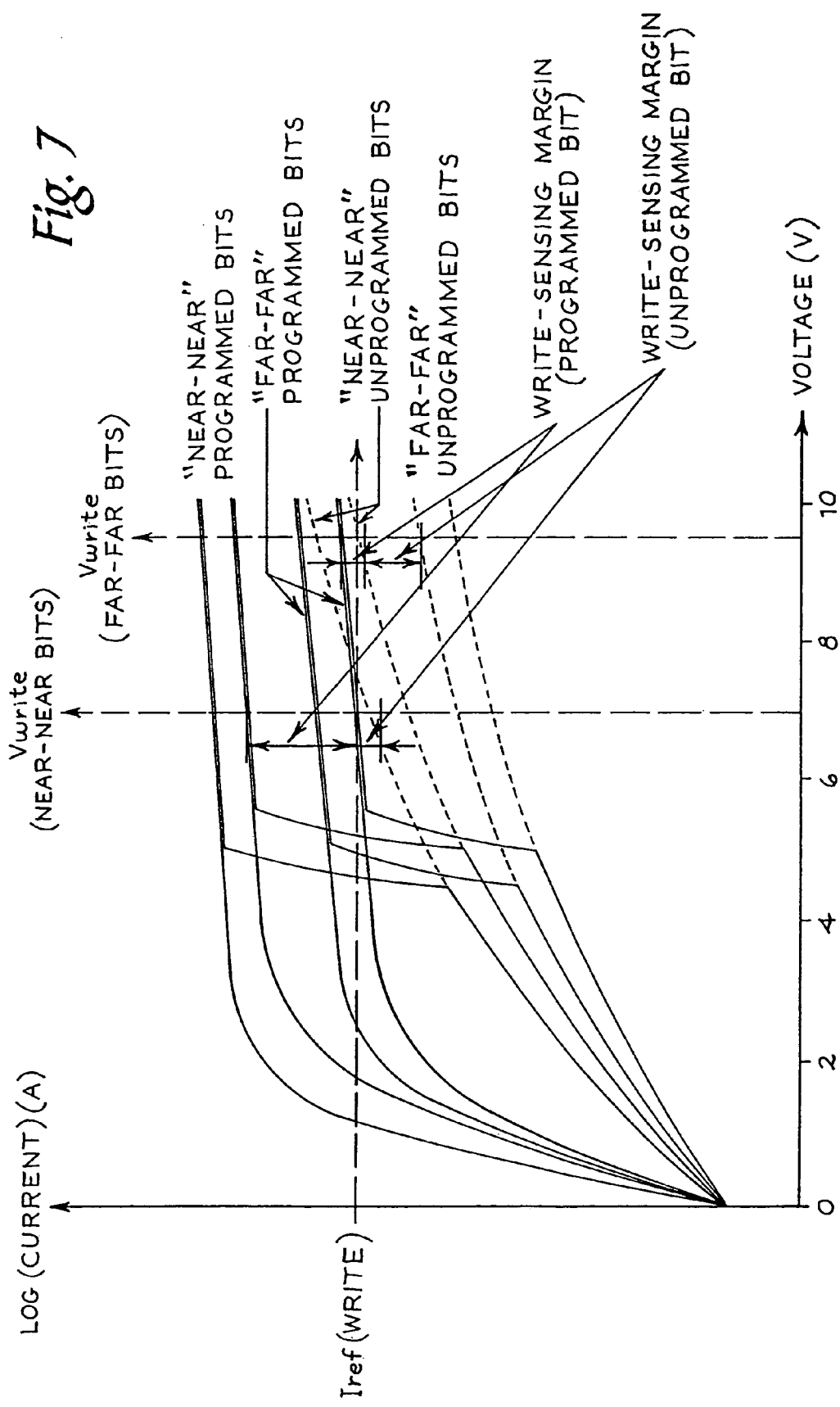
FIG. 7 is a graph of current-voltage curves for a forward-biased one-time programmable memory cell of a preferred embodiment illustrating an address-dependent $V_{write}$ compensated memory write sensing scenario.
Figure 8:
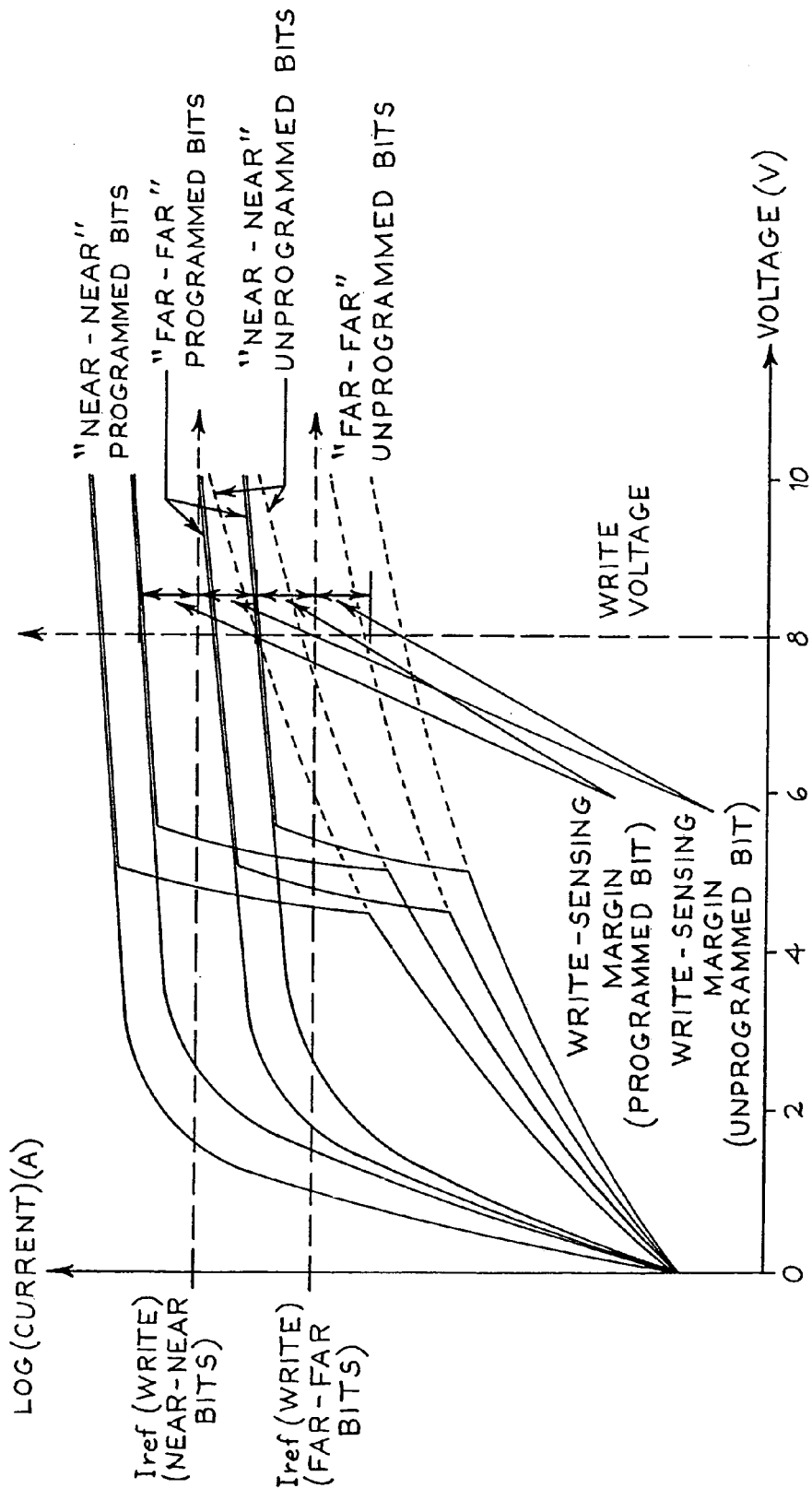
FIG. 8 is a graph of current-voltage curves for a forward-biased one-time programmable memory cell of a preferred embodiment illustrating an address-dependent $I_{ref}$ compensated memory write sensing scenario.

To overcome this problem, the apparatus 5 can comprise circuitry that selects a writing condition (e.g., voltage or reference current) to apply to a memory cell that depends on the memory cell's location (e.g., is an address-dependent reading condition). (Although sensing is similar to reading, the term "writing condition" is being used instead of "reading condition" because the sensing occurs during the write cycle in a smart write technique.) FIGS. 7 and 8 illustrate how this circuitry can compensate for the voltage and current drops by adjusting the applied voltage and the reference current, respectively, based on the memory cell's location/address. As shown in FIG. 7, by applying a lower $V_{write}$ for near-near bits than for far-far bits, a wider write-sensing margin is present. In FIG. 8, the write voltage is kept constant, but the reference current is changed depending on whether the memory cell being read is a near-near bit or a far-far bit. As with varying voltage, varying reference current based on address provides a larger write-sensing margin than in the uncompensated case shown in FIG. 6. It is important to note that while FIG. 7 and 8 show one of the voltage and reference current being fixed while the other is varied, both the voltage and reference current can vary together.

In the above paragraph, the address-dependent write condition was tailored to provide an adequate write sensing window. In addition to or as an alternative to tailoring a write condition to provide an adequate write-sensing margin, an address-dependent write condition can be used to counterbalance the reduction in programming margin. By way of background, with a constant programming voltage used across a memory array, near-near bits that are to be programmed may experience excessive power being delivered. For a one-time programmable antifuse diode, this may result in the memory cell being overstressed, causing the antifuse to breakdown and creating an open instead of a short. Additionally, it is more difficult to program far-far bits than near-near bits because less power is delivered to a far-far memory cell due to the higher resistance on the memory line. By applying an address-dependent write condition, the power delivered to near-near bits can be reduced by lowering the voltages across the memory cell based on the address of the memory cell. Conversely, the power delivered to far-far bits can be increased by increasing the voltages across the memory cell based on the address of the memory cell.

As discussed above, a memory apparatus can comprise circuitry that is operative to select a writing and/or reading condition to apply to a memory cell based on the memory cell's location with respect to one or both of a word line driver and a bit line driver. The following paragraphs describe examples of circuitry designs that can be used to implement this functionality. "Circuitry" can take any suitable form and, by way of example only, can include pure hardware components (e.g., resistors, capacitors, voltage sources, etc.), a general-purpose processor executing computer-executable program code, an application specific integrated circuit, and a programmable logic controller. It is important to note that other circuitry designs and components can be used, and the term "circuitry" in the claims should not be limited to the examples of circuitry shown in the drawings and described below.

Returning to FIG. 1, the circuitry in that apparatus 5 takes the form of an address-dependent voltage and current generator 35. In this design, the address-dependent voltage and current generator 35 selects a writing and/or reading condition to apply to a memory cell based on the memory cell's location with respect to a bit line driver and not a word line driver. As discussed below, other circuitry designs can be used that select writing and/or reading conditions to apply to a memory cell based on the memory cell's location with respect to a word line driver and not a bit line driver or based on a memory cell's location with respect to both a word line driver and a bit line driver. In the circuitry design of FIG. 1, the memory cells are organized into a plurality of zones that comprise a plurality of word lines. Here, there are N number of "zones," and a subset of the memory array address bits selects one particular zone. Within the selected zone, predetermined read/write voltages and currents are determined and used for memory operations. In this way, the generated voltages and currents for a memory operation are modulated by the address bits in a discrete manner. The larger the "N," the greater the resolution for voltage and current modulations.

The address-dependent voltage and current generator 35 determines what zone a given memory cell belongs to based on the memory cell's row and column address and applies the appropriate writing and/or reading condition for that zone (i.e., the appropriate word line voltage ($V_{WL}$), bit line voltage ($V_{BL}$), reference current for the top set of sense amplifiers ($I_{REF\_TOP}$), and reference current for the bottom set of sense amplifiers ($I_{REF\_TOP}$)). In this way, different writing and/or reading conditions are applied to different zones.

Table 1 shows a zone organization scheme of one presently preferred embodiment that applies both varying voltage and reference current based on zone location, and Table 2 shows an example of this scheme for both read and write scenarios.

TABLE 1

| Row Address | Voltage Applied | | Reference Current | |
| Zone ($2^Y$ wordlines) | Top | Bottom | Top | Bottom |
|---|---|---|---|---|
| 0   WL[(J:0) + (J + 1)*ZONE] | max | min | min | max |
| 1   WL[(J:0) + (J + 1)*ZONE] | ... | ... | ... | ... |
| .   ... | ... | ... | ... | ... |
| .   ... | ... | ... | ... | ... |
| .   ... | ... | ... | ... | ... |
| N − 1 WL[(J:0) + (J + 1)*ZONE] | min | max | max | min |

Legend:
Y = Number of Row Address bits
N = Number of Zones defined
$2^Y/N$ = Number of wordlines in each zone
$J = (2^Y/N) - 1$
Top = Refers to memory cells on bitlines driven by "top" column decoder.
Bottom = Refers to memory cells on bitlines driven by "bottom" column decoder.

As shown in these tables, the address-dependent voltage and current generator 35 supplies less of a voltage to memory cells closer to a bit line driver than to memory cells farther from a bit line driver and selects a greater reference current to apply to memory cells closer to a bit line driver than to memory cells farther from a bit line driver.

In the design in FIG. 1, the memory cells were organized into zones that run parallel to the word lines. The result of this organization is that writing and/or reading conditions varied based on a memory cell's location with respect to a bit line driver (and not a word line driver) since a memory cell's location with respect to a bit line driver is what determines which zone the memory cell is in, and, hence, which writing and/or reading conditions are applied to that cell. In other words, all the memory cells along a word line in a given zone were supplied with same word line voltage irrespective of the memory cell's location along a word line. In another design (shown in FIG. 9), different operating condition zones run parallel to the bit lines (i.e., the zones comprise a plurality of bit lines), and, hence, the writing and/or reading conditions are varied based on a memory cell's location with respect to a word line driver (and not a bit line driver). This design is useful when a number of bits are selected in parallel during a write operation. The dynamic selection of number of bits in parallel for programming can be achieved in the same manner as with the zones shown in FIG. 1. Within a selected zone, a predetermined number of bits are selected to be programmed in parallel. In a normal page write operation, a zone will be selected in sequence. The number of bits selected in parallel will dynamically change as the page is programmed.

Figure 10:
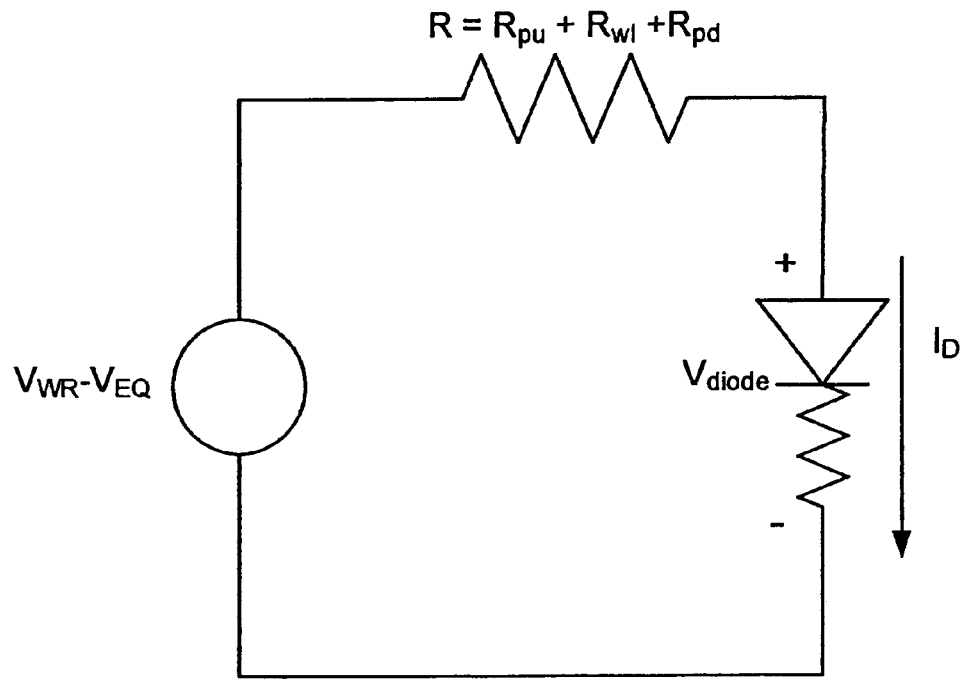
FIG. 10 is a circuit diagram illustrating the dependence of a voltage across a memory cell on word line resistance with adjacent selected memory cells.

By way of background, it is more difficult to program far-far bits given the same power delivered to any diode in the memory array. As a result, the number of far-far bits that can be selected and programmed at the same time sets a limitation on programming bandwidth. For example, when eight far-far bits are selected to be programmed on the same word line at the same time and if seven are programmed first and they are super diodes (i.e., memory cells that conduct high diode current), the total current along the word line would be quite high, and the total IR drop on the word line could limit the eighth memory cell from being programmed. Accordingly, one can only program a number of bits in parallel that will not limit at least one of the bits from being programmed. This is shown diagrammatically in FIG. 10. In this drawing, R is the total equivalent resistance, which

TABLE 2

| | | READ | | | | WRITE | | |
| Row Address | Vdiode(V) | | Iref(nA) | | Vdiode(V) | | Iref(μA) | |
| Zone RAD[4:0] | Top | Bottom | Top | Bottom | Top | Bottom | Top | Bottom |
|---|---|---|---|---|---|---|---|---|
| 0   WL[7:0]   | 2.4 | 2.1 | 222 | 333 | 9.5 | 8   | 100 | 214 |
| 1   WL[15:8]  | 2.3 | 2.2 | 250 | 250 | 9   | 8.5 | 134 | 160 |
| 2   WL[23:16] | 2.2 | 2.3 | 250 | 250 | 8.5 | 9   | 160 | 134 |
| 3   WL[31:24] | 2.1 | 2.4 | 333 | 222 | 8   | 9.5 | 214 | 100 |

Example:
Y = 5
N = 4
$2^Y/N = 8$
J = 7
Top = Refers to memory cells on bitlines driven by "top" column decoder.
Bottom = Refers to memory cells on bitlines driven by "bottom" column decoder.

comprises pull-up resistance in the column decoder ($R_{pu}$) 120, pull-down resistance in the column decoder 120 ($R_{pd}$), and word line resistance ($R_{wl}$). $I_D$ is the memory cell current, $V_{diode}$ is the voltage across the memory cell, $V_{WR}$ is the write voltage supply, $V_{BL}$ is the bit line voltage supply, and $V_{WL}$ is the word line voltage supply. $V_{WR}=V_{BL}-V_{WL}$, and $V_{EQ}$ is the equivalent voltage by adjacent programmed memory cells. The overall write bandwidth can be increased by changing the number of bits that are programmed in parallel given the address location of the selected memory cells. For example, more bits can be selected for programming in parallel if those bits are closer to the write driver than farther away from it. Thus, $V_{EQ}$ is higher for selected bits closer to the write driver than for selected bits that are farther away. Therefore, the power delivering to the all the memory cells are the same along the word line. The number of bits that are programmed can be dynamically switched as the memory cells are being programmed along a selected word line.

Table 3 shows a zone organization scheme of one presently preferred embodiment in which an address determines the number of bits selected to be programmed in parallel, and Table 4 shows an example of this scheme.

TABLE 3

| Zone | Column Address ($2^X$ bitlines) | Number of bits to Program in Parallel | |
|---|---|---|---|
| | | WL Driver (left) | WL Driver (right) |
| 0 | BL[(K:0) + (K + 1)*ZONE] | max | min |
| 1 | BL[(K:0) + (K + 1)*ZONE] | ... | ... |
| . | ... | ... | ... |
| . | ... | ... | ... |
| . | ... | ... | ... |
| N − 1 | BL[(K:0) + (K + 1)*ZONE] | min | max |

Legend:
X = Number of Column Address bits
N = Number of Zones defined
$2^X$/N = Number of bitlines in each zone
K = ($2^X$/N) − 1
Left = Refers to memory cells on wordlines driven by "left" row decoder
Right = Refers to memory cells on wordlines driven by "right" row decoder

TABLE 4

| Zone | Column Address (CAD[4:0]) | Number of bits to Program in Parallel | |
|---|---|---|---|
| | | RAD[0] = 0 | RAD[0] = 1 |
| 0 | BL[7:0] | 16 | 4 |
| 1 | BL[15:8] | 8 | 8 |
| 2 | BL[23:16] | 8 | 8 |
| 3 | BL[31:24] | 4 | 16 |

Example:
X = 5
N = 4
$2^X$/N = 8
K = 7

Figure 9:
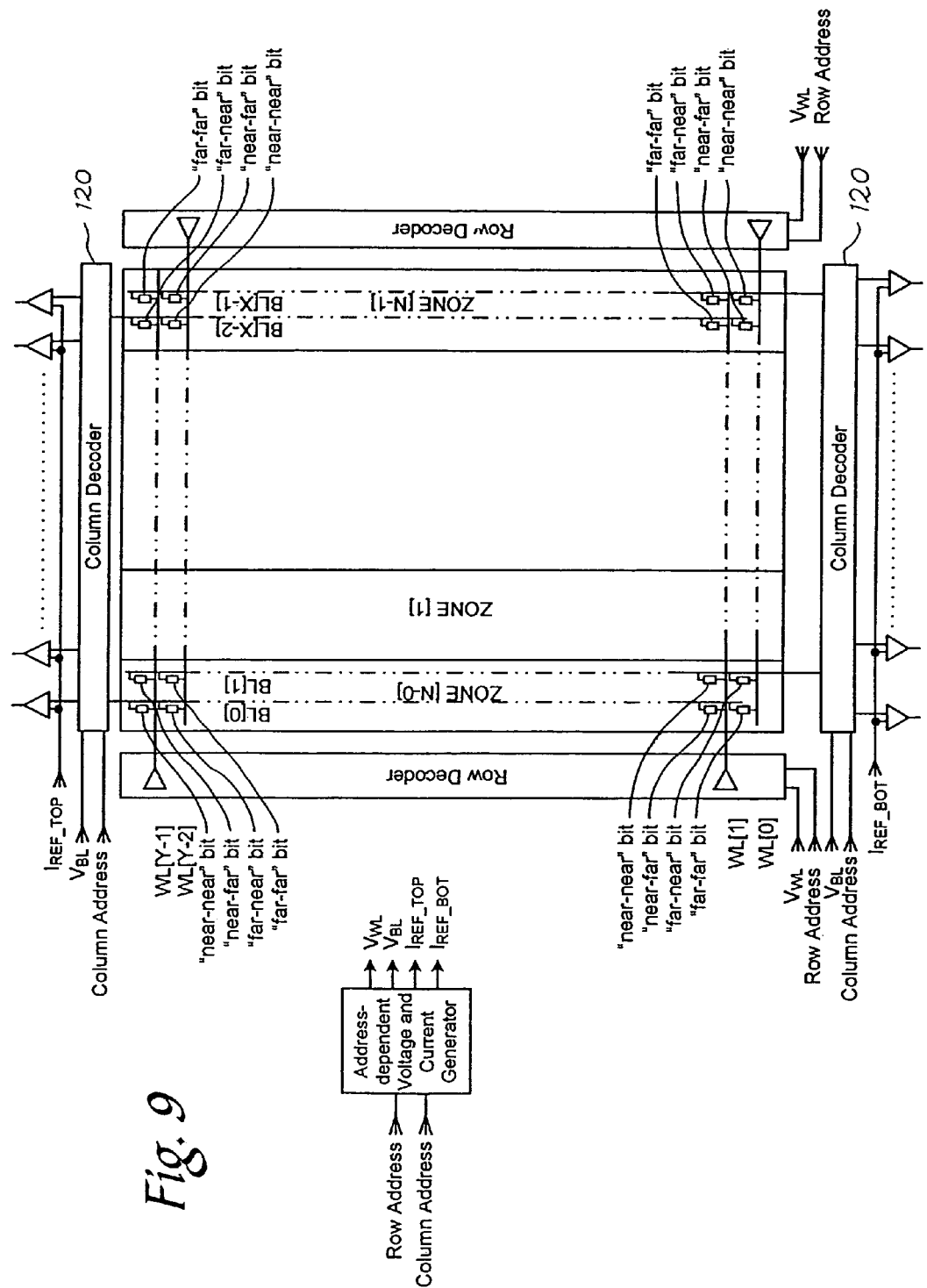
FIG. 9 is an illustration of a memory apparatus of another preferred embodiment.

There are several alternatives that can be used with these preferred embodiments. For example, while FIGS. 1 and 9 show a "horizontal" zone scheme being used independently from a "vertical" zone scheme, both "horizontal" and "vertical" zone schemes can be used simultaneously such as to vary writing and/or reading conditions based on a memory cell's location with respect to both a word line driver and a bit line driver. Further, in the above examples, word lines or bit lines were grouped in zones, and the writing and/or reading condition applied to a memory cell depended upon which zone the memory cell belonged to. Instead of using the concept of zones, writing and/or reading conditions can be determined based purely on the memory cell's address without using the concept of zones. Additionally, in the embodiments described above, a group of memory cells within a zone is subjected to a unique set of operating conditions. In an alternate embodiment, each memory cell has a unique set of operating conditions applied. The end result is that each memory cell will look exactly the same as each other. In this design, each memory cell can be considered as having its own zone.

Also, as denoted above by the phrase "writing and/or reading conditions," these preferred embodiments can be used to vary writing conditions (without varying reading conditions), reading conditions (without varying writing conditions), or both writing and reading conditions. Further, the preferred embodiments described above vary writing and/or reading conditions based on a memory cell's address because the address provides an indication of the memory cell's location with respect to a word line and/or bit line driver. In an alternate embodiment, a metric other than address that indicates the memory cell's location with respect to a word line and/or bit line driver is used to vary writing and/or reading conditions.

Finally, in the circuitry designs shown in the drawings, the address-dependent voltage and current generators select word and bit line voltages and reference currents to apply to a memory cell based on a zone associated with that memory cell. In an alternate embodiment, the circuitry only provides an address-dependent reference current, and the word line and/or bit line drivers in the row and column decoders have their own word line and bit line voltage generators, with the generators providing the voltage appropriate for their respective zones.

The forgoing detailed description has described only a few of the many possible implementations of the present invention. For this reason, this detailed description is intended by way of illustration, and not by way of limitation. It is only the following claims, including all equivalents, that are intended to define the scope of this invention.

What is claimed is:

1. An apparatus comprising:
   a plurality of word lines and word line drivers;
   a plurality of bit lines and bit line drivers;
   a plurality of memory cells, wherein each memory cell is coupled between a respective word line and bit line; and
   circuitry operative to select a writing condition to apply to a memory cell based on the memory cell's location with respect to one or both of a word line driver and a bit line driver;
   wherein the circuitry is operative to select a different writing condition to apply to memory cells that are closer to the one or both of a word line driver and a bit line driver than to memory cells that are farther from the one or both of a word line driver and a bit line driver.

2. The invention of claim 1, wherein the circuitry is operative to select a writing condition to apply to a memory cell based on the memory cell's location with respect to a word line driver but not to a bit line driver.

3. The invention of claim 1, wherein the circuitry is operative to select a writing condition to apply to a memory cell based on the memory cell's location with respect to a bit line driver but not to a word line driver.

4. The invention of claim 1, wherein the circuitry is operative to select a writing condition to apply to a memory cell based on the memory cell's location with respect to both a word line driver and a bit line driver.

5. The invention of claim 1, wherein the circuitry is further operative to select a reading condition to apply to a memory cell based on the memory cell's location with respect to one or both of a word line driver and a bit line driver.

6. The invention of claim 1, wherein the plurality of memory cells are organized into a plurality of zones, and wherein the circuitry is operative to select different writing conditions to apply to different zones.

7. The invention of claim 6, wherein each zone comprises a plurality of word lines.

8. The invention of claim 6, wherein each zone comprises a plurality of bit lines.

9. The invention of claim 6, wherein each zone comprises a plurality of word lines and bit lines.

10. The invention of claim 1, wherein each memory cell is associated with an address, and wherein the circuitry is operative to select a writing condition to apply to a memory cell based on the memory cell's address.

11. The invention of claim 1, wherein at least some of the plurality of memory cells comprise write-once memory cells.

12. The invention of claim 1, wherein at least some of the plurality of memory cells comprise write-many memory cells.

13. The invention of claim 1, wherein at least some of the plurality of memory cells comprise few-time programmable memory cells.

14. The invention of claim 1, wherein the plurality of memory cells are organized in a plurality of layers stacked vertically above one another above a single substrate.

15. The invention of claim 1, wherein the plurality of memory cells are organized in a single layer.

16. An apparatus comprising:
a plurality of word lines and word line drivers;
a plurality of bit lines and bit line drivers;
a plurality of memory cells, wherein each memory cell is coupled between a respective word line and bit line; and
circuitry operative to select a writing condition to apply to a memory cell based on the memory cell's location with respect to one or both of a word line driver and a bit line driver;
wherein the writing condition comprises a voltage, and wherein the circuitry selects less of a voltage to apply to memory cells closer to the one or both of a word line driver and a bit line driver than to memory cells farther from the one or both of a word line driver and a bit line driver.

17. An apparatus comprising:
a plurality of word lines and word line drivers;
a plurality of bit lines and bit line drivers;
a plurality of memory cells, wherein each memory cell is coupled between a respective word line and bit line; and
circuitry operative to select a writing condition to apply to a memory cell based on the memory cell's location with respect to one or both of a word line driver and a bit line driver;
wherein the writing condition comprises a reference current, and wherein the circuitry selects a greater reference current to apply to memory cells closer to the one or both of a word line driver and a bit line driver than to memory cells farther from the one or both of a word line driver and a bit line driver.

18. An apparatus comprising:
a plurality of word lines and word line drivers;
a plurality of bit lines and bit line drivers;
a plurality of memory cells, wherein each memory cell is coupled between a respective word line and bit line; and
circuitry operative to select a writing condition to apply to a memory cell based on the memory cell's location with respect to one or both of a word line driver and a bit line driver;
wherein the writing condition comprises both a voltage and a reference current, wherein the circuitry selects less voltage and a greater reference current to apply to memory cells closer to the one or both of a word line driver and a bit line driver than to memory cells farther from the one or both of a word line driver and a bit line driver.

19. An apparatus comprising:
a plurality of word lines and word line drivers;
a plurality of bit lines and bit line drivers;
a plurality of memory cells, wherein each memory cell is coupled between a respective word line and bit line; and
circuitry operative to select a reading condition to apply to a memory cell based on the memory cell's location with respect to one or both of a word line driver and a bit line driver;
wherein the circuitry is operative to select a different reading condition to apply to memory cells that are closer to the one or both of a word line driver and a bit line driver than to memory cells that are farther from the one or both of a word line driver and a bit line driver.

20. The invention of claim 19, wherein the circuitry is operative to select a reading condition to apply to a memory cell based on the memory cell's location with respect to a word line driver but not to a bit line driver.

21. The invention of claim 19, wherein the circuitry is operative to select a reading condition to apply to a memory cell based on the memory cell's location with respect to a bit line driver but not to a word line driver.

22. The invention of claim 19, wherein the circuitry is operative to select a reading condition to apply to a memory cell based on the memory cell's location with respect to both a word line driver and a bit line driver.

23. The invention of claim 19, wherein the plurality of memory cells are organized into a plurality of zones, and wherein the circuitry is operative to select different reading conditions to apply to different zones.

24. The invention of claim 23, wherein each zone comprises a plurality of word lines.

25. The invention of claim 23, wherein each zone comprises a plurality of bit lines.

26. The invention of claim 23, wherein each zone comprises a plurality of word lines and bit lines.

27. The invention of claim 19, wherein each memory cell is associated with an address, and wherein the circuitry is operative to select a reading condition to apply to a memory cell based on the memory cell's address.

28. The invention of claim 19, wherein at least some of the plurality of memory cells comprise write-once memory cells.

29. The invention of claim 19, wherein at least some of the plurality of memory cells comprise write-many memory cells.

30. The invention of claim 19, wherein at least some of the plurality of memory cells comprise few-time programmable memory cells.

31. The invention of claim 19, wherein the plurality of memory cells are organized in a plurality of layers stacked vertically above one another above a single substrate.

32. The invention of claim 19, wherein the plurality of memory cells are organized in a single layer.

33. An apparatus comprising:
a plurality of word lines and word line drivers;
a plurality of bit lines and bit line drivers;
a plurality of memory cells, wherein each memory cell is coupled between a respective word line and bit line; and
circuitry operative to select a reading condition to apply to a memory cell based on the memory cell's location with respect to one or both of a word line driver and a bit line driver;
wherein the reading condition comprises a voltage, and wherein the circuitry selects less of a voltage to apply to memory cells closer to the one or both of a word line driver and a bit line driver than to memory cells farther from the one or both of a word line driver and a bit line driver.

34. An apparatus comprising:
a plurality of word lines and word line drivers;
a plurality of bit lines and bit line drivers;
a plurality of memory cells, wherein each memory cell is coupled between a respective word line and bit line; and
circuitry operative to select a reading condition to apply to a memory cell based on the memory cell's location with respect to one or both of a word line driver and a bit line driver;
wherein the reading condition comprises a reference current, and wherein the circuitry selects a greater reference current to apply to memory cells closer to the one or both of a word line driver and a bit line driver than to memory cells farther from the one or both of a word line driver and a bit line driver.

35. An apparatus comprising:
a plurality of word lines and word line drivers;
a plurality of bit lines and bit line drivers;
a plurality of memory cells, wherein each memory cell is coupled between a respective word line and bit line; and
circuitry operative to select a reading condition to apply to a memory cell based on the memory cell's location with respect to one or both of a word line driver and a bit line driver;
wherein the reading condition comprises both a voltage and a reference current, wherein the circuitry select less of a voltage and a greater reference current to apply to memory cells closer to the one or both of a word line driver and a bit line driver than to memory cells farther from the one or both of a word line driver and a bit line driver.

36. An apparatus comprising:
a plurality of word lines and word line drivers;
a plurality of bit lines and bit line drivers;
a plurality of memory cells, wherein each memory cell is coupled between a respective word line and bit line; and
circuitry operative to select a number of memory cells to be programmed in parallel based on memory cell location with respect to one or both of a word line driver and a bit line driver;
wherein the circuitry is operative to select a different number of memory cells to be programmed in parallel for memory cells that are closer to the one or both of a word line driver and a bit line driver than for memory cells that are farther from the one or both of a word line driver and a bit line driver.

37. The invention of claim 36, wherein the plurality of memory cells are organized into a plurality of zones, and wherein the circuitry is operative to select a number of memory cells to be programmed in parallel based on a memory cell's zone.

38. The invention of claim 37, wherein each zone comprises a plurality of word lines.

39. The invention of claim 37, wherein each zone comprises a plurality of bit lines.

40. The invention of claim 37, wherein each zone comprises a plurality of word lines and bit lines.

41. The invention of claim 36, wherein at least some of the plurality of memory cells comprise write-once memory cells.

42. The invention of claim 36, wherein at least some of the plurality of memory cells comprise write-many memory cells.

43. The invention of claim 36, wherein at least some of the plurality of memory cells comprise few-time programmable memory cells.

44. The invention of claim 36, wherein the plurality of memory cells are organized in a plurality of layers stacked vertically above one another above a single substrate.

45. The invention of claim 36, wherein the plurality of memory cells are organized in a single layer.

* * * * *